(12) United States Patent  (10) Patent No.: US 9,824,769 B2
Dusa et al.  (45) Date of Patent: Nov. 21, 2017

(54) FUSIBLE LINK CELL WITH DUAL BIT STORAGE

(71) Applicant: Texas Instruments Incorporated, Dallas, TX (US)

(72) Inventors: Sunil Kumar Dusa, Plano, TX (US); Richard Allen Bailey, Richardson, TX (US); Archana Venugopal, Dallas, TX (US); John Anthony Rodriguez, Dallas, TX (US); Michael Allen Ball, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/146,049

(22) Filed: May 4, 2016

(65) Prior Publication Data

US 2017/0018311 A1   Jan. 19, 2017

Related U.S. Application Data

(60) Provisional application No. 62/193,456, filed on Jul. 16, 2015.

(51) Int. Cl.
  *G11C 17/18*  (2006.01)
  *G11C 17/16*  (2006.01)
(52) U.S. Cl.
  CPC ............ *G11C 17/18* (2013.01); *G11C 17/165* (2013.01)

(58) Field of Classification Search
  CPC ................................. G11C 17/16; G11C 17/18
  See application file for complete search history.

(56) References Cited

U.S. PATENT DOCUMENTS

| | | | | |
|---|---|---|---|---|
| 5,923,590 A | * | 7/1999 | Yero | G11C 7/00 365/189.15 |
| 6,356,496 B1 | * | 3/2002 | Carroll | G11C 11/5692 257/209 |
| 2002/0186592 A1 | * | 12/2002 | Pagliato | G11C 11/56 365/185.21 |
| 2003/0207526 A1 | * | 11/2003 | Gelsomini | H01L 23/5252 438/200 |
| 2008/0298114 A1 | * | 12/2008 | Liu | G11C 11/56 365/148 |
| 2010/0177548 A1 | * | 7/2010 | Min | G11C 17/16 365/96 |

* cited by examiner

*Primary Examiner* — Douglas King
(74) *Attorney, Agent, or Firm* — Kenneth Liu; Charles A. Brill; Frank D. Cimino

(57) ABSTRACT

A fuse-programmable register or memory location having a plurality of fusible links of differing electrical characteristics in parallel. In one embodiment, three fusible links with different resistances are provided, such that application of a programming voltage non-uniformly distributes the current among the links, allowing varying voltages to selectively blow one or more of the links. Sensing of the programmed state is performed by applying a voltage across the parallel links and measuring the current in comparison with a plurality of reference currents. Reduction in the overhead chip area per bit and in the serial data communication latency are obtained.

16 Claims, 5 Drawing Sheets

FUSIBLE LINK CELL WITH DUAL BIT STORAGE

CROSS-REFERENCE TO RELATED APPLICATIONS

This application claims priority, under 35 U.S.C. §119(e), of Provisional Application No. 62/193,456, filed Jul. 16, 2015, incorporated herein by this reference.

STATEMENT REGARDING FEDERALLY SPONSORED RESEARCH OR DEVELOPMENT

Not applicable.

BACKGROUND OF THE INVENTION

This invention is in the field of semiconductor integrated circuits. Embodiments are more specifically directed to programmable memory locations of the fusible link type in such integrated circuits.

Many modern integrated circuits, particularly those that incorporate multiple functional components of a computer system for controlling and managing a wide range of functions and useful applications, include some type of non-volatile memory resources for storing information. This non-volatile memory may vary in size from a single register location, for example a small "trim" register for setting a particular analog level or setting for the integrated circuit, to one or more configuration registers for customizing the function of the integrated circuit, to an array of hundreds of kilobytes or more of programmable read-only memory (PROM) for storing the device firmware or other program code. These non-volatile memories permit the device manufacturer or system integrator to adjust and configure the functionality of the integrated circuit.

Semiconductor fuse elements, or fusible links, have been widely used for years to implement smaller programmable non-volatile memories such as trim registers and configuration registers. Semiconductor fuses are also commonly used to selectively enable "redundant" memory cells to replace defective cells in larger memory arrays, and even for storing small blocks of program code. Conventional fusible links are typically constructed as a small conductive element, for example of polycrystalline silicon or a metal conductor, often having a small necked-down portion of smaller cross-sectional area than the remainder of the conductor. "Blowing" or programming of the fusible link is typically carried out by applying current of a sufficient magnitude to cause a physical change in the structure of the fusible link, for example by melting the material to open the link. Another type of fusible link is constructed so that the programming current instead degrades the fuse structure to significantly decrease its resistance, without opening the link. So-called "antifuses" are fusible links that are normally non-conductive but are "blown" closed when programmed. Laser-programmable fuses are fusible links that are blown open by externally-applied laser energy, and as such are typically programmed by the device manufacturer. For any of these types, once the fusible link is programmed, its state is non-volatile, in that the link cannot be again electrically closed or otherwise returned to its original state.

In modern integrated circuits realized using current-day technology, it has been observed that the chip area required for the peripheral circuitry involved in electrically programming and sensing the state of a fusible link dwarfs the chip area consumed by the fusible link itself. For example, in one conventional device, the fusible link itself occupies on the order of 1.5% of the chip area required for the peripheral programming and sense circuitry for that single fusible link. Accordingly, the implementation of even a modest register location using fusible links can require significant chip area, on the order of 70× the chip area of the links themselves.

By way of further background, conventional register locations involving fusible links are often implemented as a "fuse chain", with the peripheral circuitry for the links in that chain serially connected to reduce the number of conductors required to communicate data to and from the register. Serial data communication to and from wide registers, such as 64-bit or larger registers, thus necessarily results in significant latency and very slow bit transmission rates. For example, the serial communication of 64 bits at a clock cycle time of about 300 nsec requires nearly 20 µsec, which is extremely slow as compared with the computational rates of modern high-speed integrated circuits.

BRIEF SUMMARY OF THE INVENTION

Disclosed embodiments provide a programmable non-volatile memory element and peripheral circuitry that may be efficiently realized in a semiconductor integrated circuit.

Disclosed embodiments provide such an element and circuitry for which the chip area per bit is greatly reduced over conventional implementations.

Disclosed embodiments provide such an element and circuitry that provides faster serial data access than conventional implementations.

Other objects and advantages of the disclosed embodiments will be apparent to those of ordinary skill in the art having reference to the following specification together with its drawings.

According to certain embodiments, a fusible link circuit and method of programming and reading such a circuit is implemented using three or more fusible links of different programming voltages connected in parallel with one another. A programming circuit applies a selected programming voltage to the parallel-connected fusible links to program none, one, two, or three of the links. Sense circuitry is provided that outputs a digital value of two or more bits corresponding to the parallel resistance of the remaining fusible links in parallel.

DETAILED DESCRIPTION OF THE INVENTION

The one or more embodiments described in this specification are implemented into register locations of a large-scale integrated circuit, as it is contemplated that such implementation is particularly advantageous in that context. However, it is also contemplated that concepts of this invention may be beneficially applied in other applications, for example in smaller-scale integrated circuits such as analog circuits. Accordingly, it is to be understood that the following description is provided by way of example only, and is not intended to limit the true scope of this invention as claimed.

Figure 1:
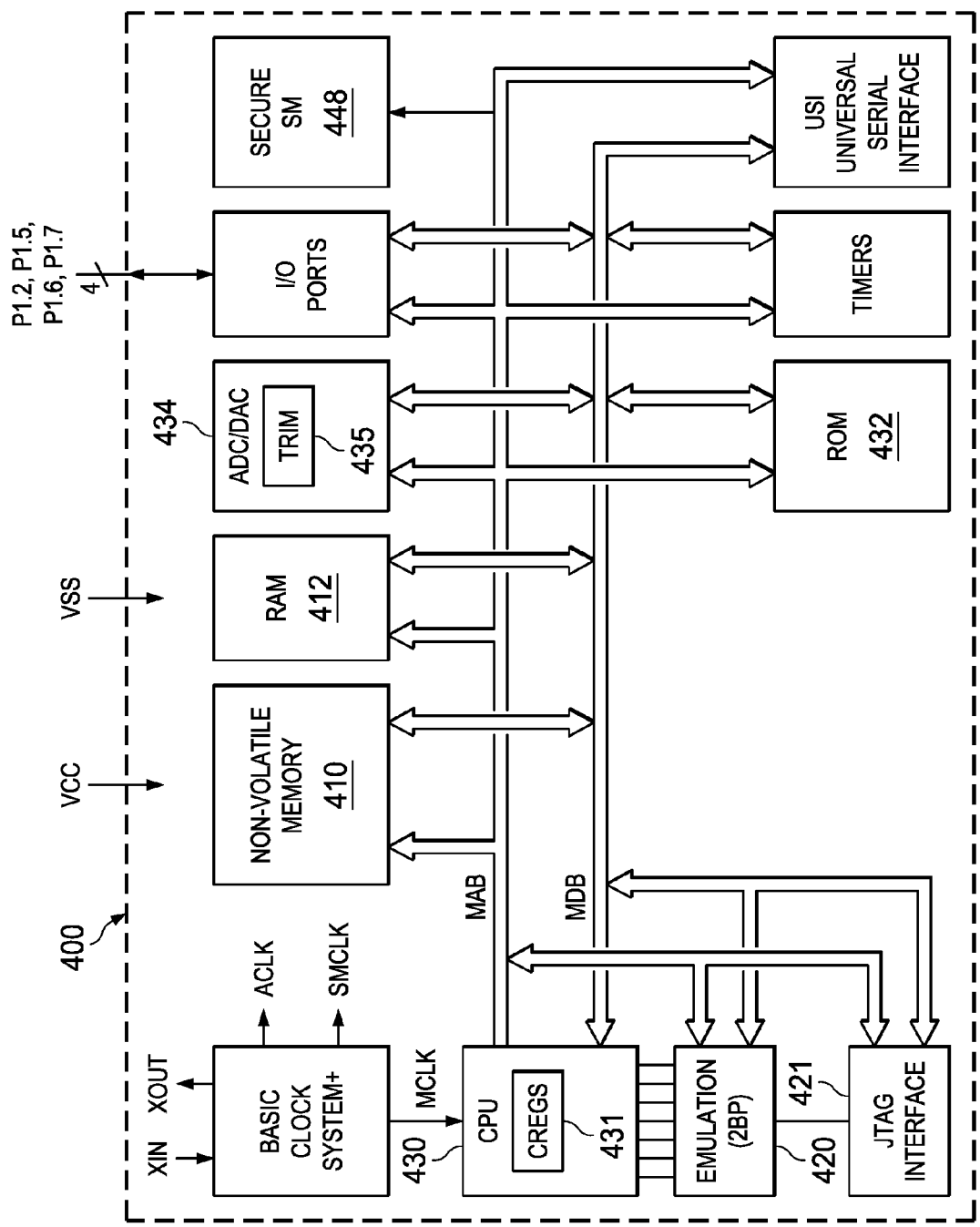
FIG. 1 is an electrical diagram, in block form, of the architecture of a system-on-a-chip (SoC) device in which one or more embodiments are implemented.

FIG. 1 illustrates, in block diagram form, the generalized architecture of a large-scale integrated circuit in which embodiments are implemented, in this example in the form of a so-called system-on-a-chip (SoC) 400. SoC 400 as shown in FIG. 1 includes central processing unit (CPU) 430 serving as the main programmable logic of the device. CPU 430 may be realized, for example, by a microprocessor such as an OMAP processor core as utilized in the MSP430 family of microcontrollers available from Texas Instruments Incorporated. As known in the art, SoC 400 may be constructed to include multiple CPUs 430, which may be of the same type as one another or which may be processors of other types such as generic programmable processors, digital signal processors (DSPs) or other application-specific or customized logic, as appropriate for the particular function of SoC 400.

The architecture of SoC 400 includes several memory resources including programmable non-volatile memory 410, random access memory (RAM) 412, and read-only memory (ROM) 432, each accessible to CPU 430 by way of main address bus MAB and main data bus MDB. While these memory resources 410, 412, 432 are shown in FIG. 1 as unitary blocks, these memory resources may alternatively be realized as multiple memory blocks or arrays, including local memory resources within one or more of the various circuit functions of SoC 400 that may not be directly accessible via address bus MAB and data bus MDB. RAM 412, in particular, may be realized by any one or more of a number of memory cell types and arrangements, including static RAM (SRAM), dynamic RAM (DRAM), and the like. Non-volatile memory 410 may be constructed of one or more conventional types of programmable memory technology, including electrically programmable read-only memory (EPROM), "flash" memory, ferroelectric random access memory (FRAM), and one-time programmable (OTP) memory including fusible link storage locations constructed according to these embodiments. In any case, non-volatile memory 410 and ROM 432 are suitable for storing the "firmware" of SoC 400 as well as other executable program code for one or more applications carried out by SoC 400 in its normal operation.

Various peripheral functions of SoC 400 may be also coupled to buses MAB, MDB so as to be accessible to CPU 430 and one another. In the architecture of FIG. 1, these peripherals include direct memory access (DMA) engine 433 for providing DMA access to and from the various memory resources of SoC 400, various signal processing functions such as analog-to-digital converters (ADC) and digital-to-analog converters (DAC) 434, communications ports, timers, serial and other interface functions, and the like. These various peripheral functions may be within the address space of SoC 400 or may be otherwise accessible to CPU 430 and the other functional circuitry of the device. Security features within SoC 400 of this example are incorporated by secure state machine 448 in combination with stored security parameters in one or more secure memory resources. SoC 400 also includes other functions such as its clock system, emulation system 420, JTAG interface 421, and the like.

Those skilled in the art having reference to this specification will recognize that SoC 400 may include additional or alternative functions to those shown in FIG. 1, or may have its functions arranged according to a different architecture from that shown.

As shown in FIG. 1, CPU 430 includes one or more banks of programmable circuits in the form of programmable non-volatile registers, including one or more control registers 431 within or accessible to CPU 430 and one or more trim registers 435 within or accessible to ADC/DAC block 434. Control registers 431 may store configuration information and other data useful in defining or customizing the function of SoC 400, among other purposes, and trim registers 435 may store adjustment ("trim") levels and settings for analog levels as may be used in ADC and DAC circuitry. According to these embodiments, these registers 431, 435 may be constructed as sets of multiple-bit fusible link circuits as will be described below. In addition, one or more locations of non-volatile memory 410 may be realized as sets of multiple-bit fusible link circuits, constructed according to these embodiments, for storing executable program instructions for CPU 430 and other programmable logic within SoC 400. Other programmable non-volatile register and memory locations within SoC 400 may additionally, or alternatively, be constructed as one or more multiple-bit fusible link circuits constructed according to these embodiments.

Figure 2:
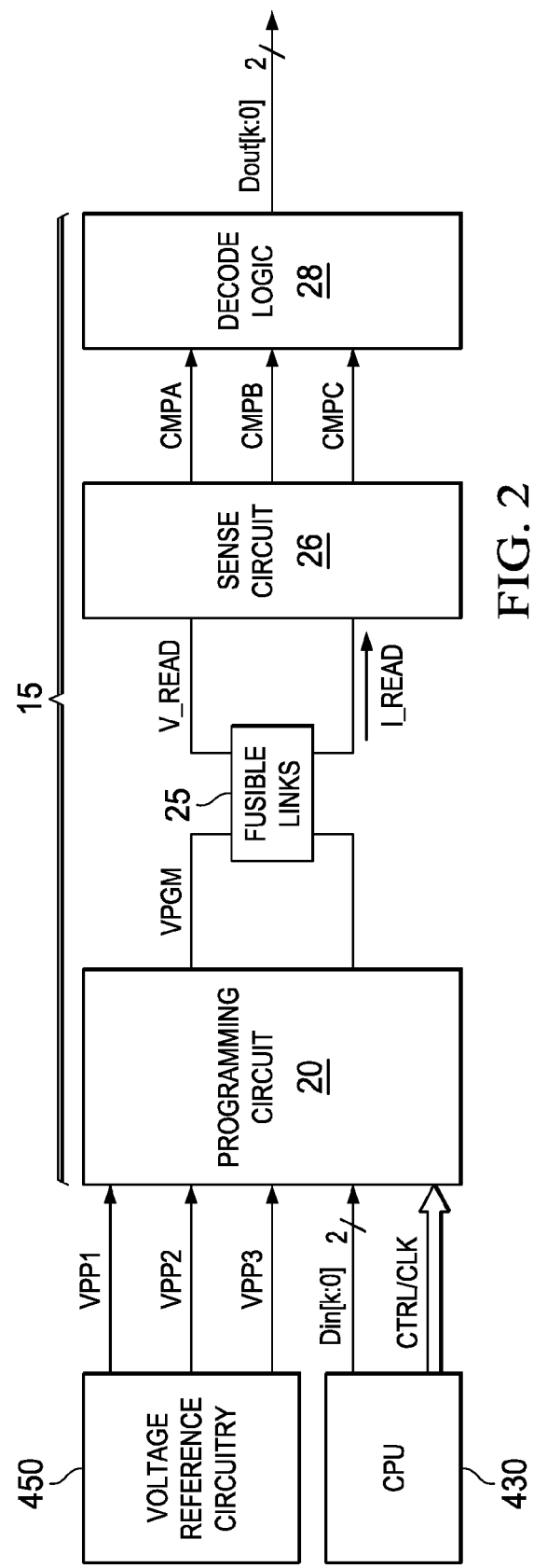
FIG. 2 is an electrical diagram, in block form, of the architecture of a programmable circuit as implemented in the SoC device of FIG. 1 according to embodiments.

FIG. 2 illustrates the architecture of programmable fusible link circuit 15 as may be used to store two or more bits in one of the register locations or other non-volatile memory stores of SoC 400 according to these embodiments. Fusible link circuit 15 includes programming circuit 20, sense circuit 26, and decode logic 28, in combination with multiple fusible links 25 that provide the non-volatile storage. As will be described in connection with an additional embodiment, multiple instances of this fusible link circuit 25 may be combined to constitute a register or memory location of the desired data width.

In the example of FIG. 2, programming circuit 20 is in communication with CPU 430 to receive input data Din[k:0], as well as control signals and, in some embodiments, a clock signal for synchronous operation. Programming circuit 20 also receives a set of programming voltages VPP1, VPP2, VPP3, etc. (depending on the number of fusible links 25) from voltage reference circuitry 450 deployed within SoC 400. Voltage reference circuitry 450 may be constructed in the conventional manner, such as based on a bandgap reference circuit or the like, to produce programming voltages VPP1, VPP2, VPP3 at the appropriate levels as will be described below. In response to multiple-bit input data Din[k:0] from CPU 430, programming circuit 20 applies programming voltage VPGM at a selected one of programming voltages VPP1, VPP2, VPP3 (or no voltage, as the case may be) to program fusible links 25 accordingly. In the example described below, the programming of fusible links 25 results from the selected programming voltage VPGM changing the structure and thus the electrical resistance of one or more of fusible links 25.

According to this embodiment, sense circuit 26 senses the electrical resistance of fusible links 25 by applying a read voltage V_READ and sensing a read current I_READ conducted by fusible links 25 in response. Sense circuit 26 forwards the results of its sensing to decode logic 28 on lines CMPA, CMPB, CMPC, etc. (depending on the number of levels sensed), which in turn decodes the states on those lines CMPA, CMPB, CMPC into digital output data [k:0] and forwards that data to the desired recipient (e.g., CPU 430).

Figure 3:
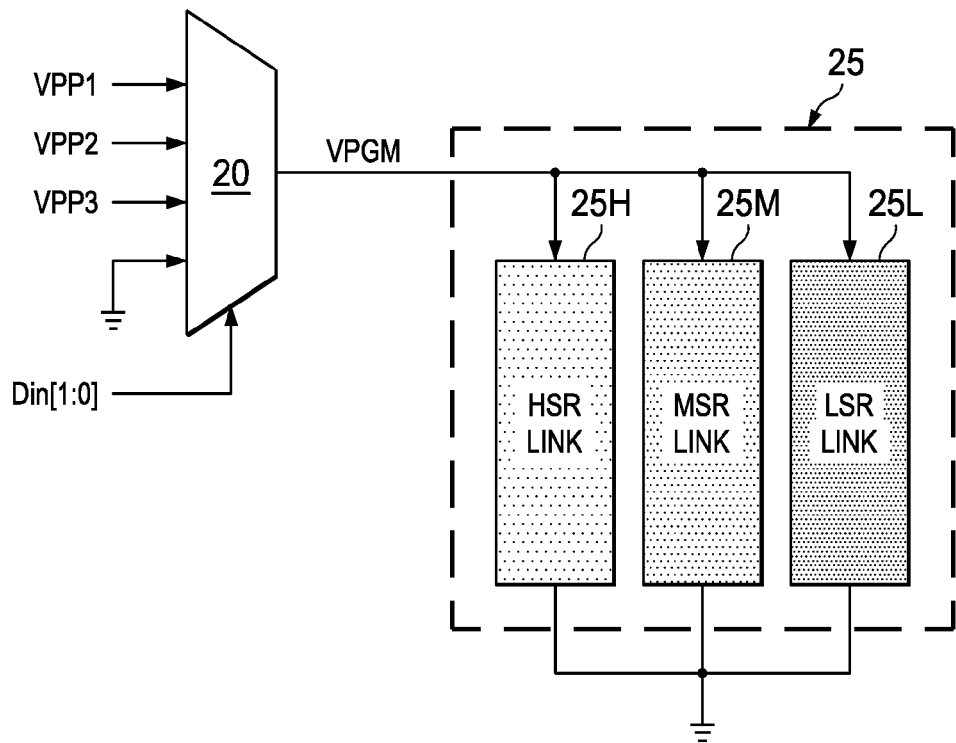
FIG. 3 is an electrical diagram, in block and schematic form, of a fusible link circuit in combination with its programming circuit in the programmable circuit of FIG. 2, according to an embodiment.

FIG. 3 illustrates the construction of fusible links 25 in combination with programming circuitry 20. According to this embodiment, three fusible links 25H, 25M, 25L are connected in parallel with one another between a node receiving programming voltage VPGM from programming circuitry 20 and a reference voltage (e.g., device ground). Fusible links 25H, 25M, 25L are constructed to have different programming voltages from one another. As will be described in further detail below, these different programming voltages provide the ability to selectively program (e.g., "blow" open) one or more fusible links 25H, 25M, 25L by selecting the level of the applied programming voltage VPGM.

In the embodiment of FIG. 3, fusible links 25H, 25M, 25L are constructed as semiconductor elements with different sheet resistances from one another. These different sheet resistances result in their resistance values differing from one another, such that application of a programming voltage VPGM across the parallel network of fusible links 25H, 25M, 25L unequally distributes the current among the links. In one implementation, high sheet resistance fusible link 25H is constructed of polycrystalline silicon ("polysilicon") of a relatively light dopant concentration, while medium sheet resistance fusible link 25M and low sheet resistance fusible link 25L are constructed of polysilicon with a heavier dopant concentration than link 25H. In one implementation, low sheet resistance fusible link 25L is clad with a conventional metal silicide film (e.g., titanium silicide, tungsten silicide, or the like) to have a higher conductivity than fusible link 25M, even though the polysilicon of the two links 25M, 25L is at the same dopant concentration. In one example, the sheet resistance of fusible link 25H is about four times that of fusible link 25M, and the sheet resistance of fusible link 25M is about twenty times that of fusible link 25L. With links 25 constructed at the same dimensions (i.e., the same width and length) as one another and with these sheet resistances, the resistance of parallel-connected fusible links 25H, 25M, 25L in this example will vary at the same relative ratio (80:20:1) as the sheet resistances, and will conduct currents that vary at the inverse of that same relative ratio (1:4:80) upon application of a voltage across the network.

It is contemplated that other approaches for distinguishing the programming voltages and electrical resistances of the individual fusible links from one another may alternatively or additionally be used. For example, in addition to or instead of differences in sheet resistance, the geometries of the fusible links may vary from one another to provide these differences. Another approach is to use other materials (e.g., metals, conductive metal compounds other than a silicide cladding) in realizing one or more of the parallel-connected fusible links. It is contemplated that those skilled in the art having reference to this specification will be readily able to implement such variations in programmability and resistance for particular realizations.

In this embodiment, the physical programming mechanism is excessive resistive heating that causes melting of the link material, irreversibly opening the link. For fusible links 25H, 25M, 25L with different sheet resistances and that thus conduct different currents when connected in parallel, the corresponding variation in $I^2R$ power dissipation and resistive heating results in fusible links 25H, 25M, 25L having differing programming voltages from another. Specifically, a relatively low programming voltage may result in sufficient current through low resistance link 25L to blow it open, but insufficient current through the other links 25M, 25H (even after link 25L blows open) to program those links. This effect allows selection of the level of the applied programming voltage VPGM across the parallel-connected fusible links 25H, 25M, 25L to determine whether none, one (low sheet resistance link 25L alone), two (medium and low sheet resistance links 25M, 25L, respectively), or all three fusible links 25H, 25M, 25L are blown open. An example of the post-programming states of parallel-connected fusible links 25H, 25M, 25L constructed as described above, resulting from the application of various programming voltages in response to the possible states of input data Din[1:0], follows:

| Din[1:0] | Voltage VPGM | Link 25H | Link 25M | Link 25L |
|---|---|---|---|---|
| 00 | ≤1.5 V | closed | closed | closed |
| 01 | 3.0 V | closed | closed | open |
| 10 | 3.8 V | closed | open | open |
| 11 | ≥4.6 V | open | open | open |

A number of factors are involved in determining the power dissipation and duration at which a particular link of a specific construction will blow. In addition, the blowing of one of the lower resistance links at a particular voltage will change the electrical characteristics of the parallel network, specifically the parallel resistance of the remaining links and thus the individual and cumulative currents conducted through those remaining links. Accordingly, it is contemplated that the particular programming voltages for blowing the desired number of fusible links 25H, 25M, 25L will typically be determined by characterizing the response of actual constructed devices.

Other conventional programming mechanisms may alternatively be used, including such mechanisms that increase the resistance of the fusible links without blowing the links open, and anti-fuse mechanisms that reduce the resistance of the links.

Figure 4:
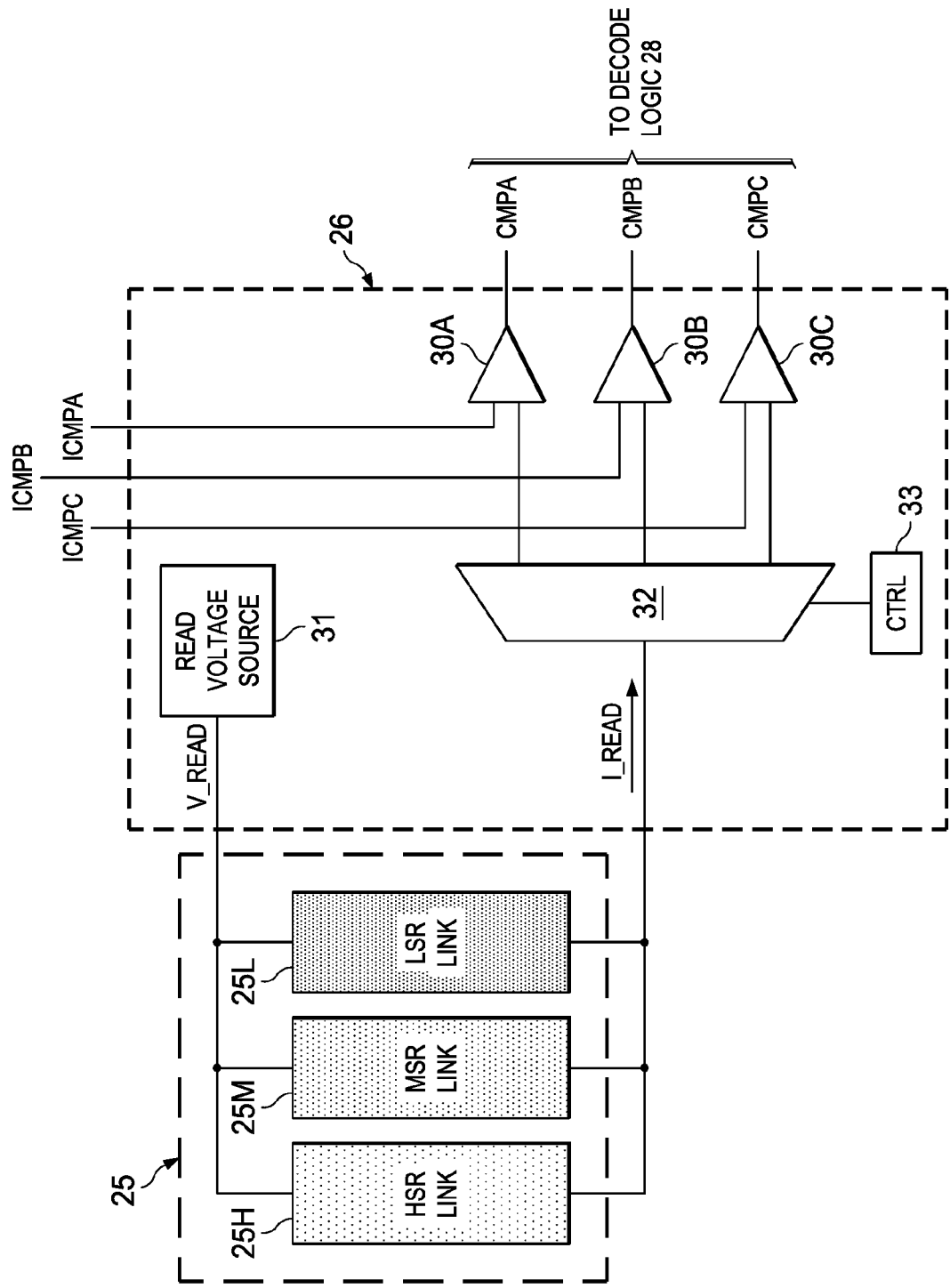
FIG. 4 is an electrical diagram, in block and schematic form, of a fusible link circuit in combination with its sense circuit in the programmable circuit of FIG. 2, according to an embodiment.

FIG. 4 illustrates the architecture of sense circuit 26 in combination with fusible links 25 according to this embodiment. Sense circuit 26 includes read voltage source 31, which may be constructed as a bandgap reference circuit or other conventional circuit for producing a stable voltage, and which generates read voltage V_READ for application to one side of the parallel-connected fusible links 25H, 25M, 25L. An input of demultiplexer is connected to the opposite side of the parallel network to receive read current I_READ from the remaining fusible links 25H, 25M, 25L. Demultiplexer 32 has outputs coupled to an input of each of comparators 30A, 30B, 30C, and selectively applies read current I_READ to one of those comparators 30A, 30B, 30C in response to a select input from control circuit 33. Comparators 30A, 30B, 30C are conventional current comparators that each receive a reference current ICMPA, ICMPB, ICMPC, respectively, at its other input and produce a logic level at its respective output CMPA, CMPB, CMPC in response to the comparison of read current I_READ with those reference currents. Reference currents ICMPA, ICMPB, ICMPC may be generated by conventional current sources (not shown), for example at the output of a bandgap reference circuit or other conventional circuit for generating a stable output current.

Alternatively, comparators 30A, 30B, 30C may each directly receive read current I_READ from fusible links 25 (i.e., without demultiplexer 32), in which case control circuit 33 operates to selectively enable one of those comparators 30A, 30B, 30C at a time to perform the comparison.

In operation, the programmed state of fusible links 25 is sensed by sense circuit 26 comparing the read current I_READ with each of reference currents ICMPA, ICMPB, ICMPC to determine the state of fusible links 25H, 25M, 25L. To accomplish this function, read voltage source 31 applies read voltage V_READ to the parallel-connected fusible links 25H, 25M, 25L, at a sufficiently low voltage as compared with the programming voltages, so that the sensing operation does not itself program any of fusible links 25 and undesirably alter the contents of the register or store from its programmed state. The read current I_READ conducted by the remaining ones of fusible links 25H, 25M, 25L in response to read voltage V_READ is sequentially applied to comparator 30A for comparison with reference current ICMPA, to comparator 30B for comparison with reference current ICMPB, and to comparator 30C for comparison with reference current ICMPC. The logic states of outputs CMPA, CMPB, CMPC resulting from these sequential comparisons are forwarded to decode logic 28.

For an example of the operation of sense circuit 26, consider fusible links 25H, 25M, 25L as constructed with varying sheet resistances as described above (i.e., high sheet resistance, low sheet resistance without silicide, and low sheet resistance with silicide), and having the same length and width as one another. In one example, fusible links 25H, 25M, 25L constructed in this manner have resistances of about 3.2 kΩ, 800Ω, and 40Ω, respectively, when intact (i.e., not programmed). As discussed above, the possible programmed states of fusible links 25 are: none blown, one (fusible link 25L) blown, two (links 25M and 25L) blown, and all three fusible links 25H, 25M, 25L blown. The parallel resistances of the remaining fusible links 25 in these programmed states, and the read current I_READ at a read voltage V_READ of 2.5 volts (below the lowest programming voltage, for link 25L) for this example, are:

| State | Resistance | I READ (@2.5 volts) |
|---|---|---|
| None blown | 38 Ω | 65.8 mA |
| 25L blown | 640 Ω | 3.9 mA |
| 25L and 25M blown | 3.2 kΩ | 0.8 mA |
| All blown | ∞ | 0 mA |

Accordingly, at a read voltage V_READ of 2.5 volts, a reference current ICMPA of 50 mA can distinguish between none of fusible links 25 being blown and one link (25L) blown, a reference current ICMPB of 2.5 mA can distinguish between only one fusible link (25L) blown and two fusible links (25L and 25M) blown, and a reference current ICMPC of 0.5 mA can distinguish between two fusible links (25L and 25M) blown and all fusible links blown. Using these reference currents ICMPA, ICMPB, ICMPC, the logical output states at comparator outputs CMPA, CMPB, CMPC for these various programmed states is:

| State | CMPC | CMPB | CMPA |
|---|---|---|---|
| None blown | 1 | 1 | 1 |
| 25L blown | 1 | 1 | 0 |
| 25L and 25M blown | 1 | 0 | 0 |
| All blown | 0 | 0 | 0 |

The logic levels of comparator outputs CMPA, CMPB, CMPC are forwarded to decode logic 28 for decoding into a digital output word.

Various alternative arrangements to this implementation of sense circuit 26 are contemplated. One such alternative is to use a single current comparator for performing all three comparisons, with additional switching logic sequentially applying the multiple reference currents ICMPA, ICMPB, ICMPC to the input of this single current comparator, and latches storing the CMPA, CMPB, CMPC results that are sequentially obtained. In sense circuit 26 and in these and other variations, the appropriate read voltage V_READ may be alternatively generated by programming circuit 20, for example at the same non-zero voltage level selected during programming if none of fusible links 25H, 25M, 25L are to be blown. This approach eliminates the need for an additional voltage reference circuit 31 for applying the read voltage V_READ to be implemented in or with sense circuit 26.

Figure 5:
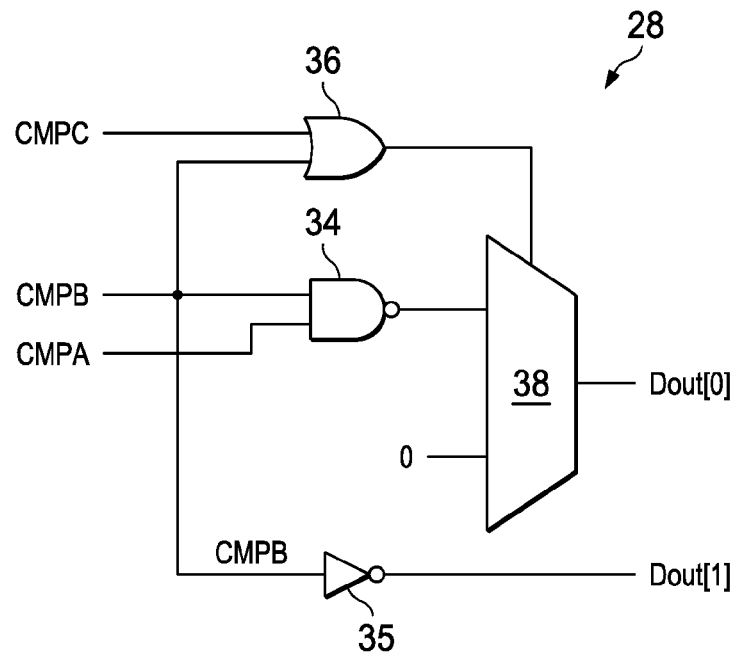
FIG. 5 is an electrical diagram, in schematic form, of decode logic in the programmable circuit of FIG. 2, according to an embodiment.

As mentioned above, the three parallel fusible links 25 provided in this embodiment are capable of being programmed into four distinct states. Decode logic 28, of which an implementation is shown in FIG. 5 by way of example, is provided to decode the three comparator outputs CMPA, CMPB, CMPC into a two-bit output word Dout[1:0] indicating the programmed state of fusible links 25. In this example, decode logic 28 is constructed as combinational logic including NAND gate 34, which receives comparator outputs CMPA, CMPB at its two inputs and has its output connected to one input of multiplexer 38. The other input of multiplexer 38 receives a hard-wired "0" logic state (i.e., ground), and has its select input connected to the output of OR gate 36, which receives comparator outputs CMPB, CMPC at its two inputs. The output of multiplexer 38 produces bit Dout[0] of the digital output word from decode logic 28. Bit Dout[1] is produced by inverter 35, which receives comparator output CMPB at its input. According to this arrangement, the comparator results from sense circuit 26 are decoded into a two-bit digital word Dout[1:0] as follows:

| State (blown fuses) | CMPC | CMPB | CMPA | Dout[1] | Dout[0] |
|---|---|---|---|---|---|
| None blown | 1 | 1 | 1 | 0 | 0 |
| 25L blown | 1 | 1 | 0 | 0 | 1 |
| 25L, 25M | 1 | 0 | 0 | 1 | 0 |
| All | 0 | 0 | 0 | 1 | 1 |

This digital word Dout[1:0] is then forwarded from fusible link circuit 15 (FIG. 2) to the intended destination for that data word.

Of course, various alternative arrangements of combinational or sequential logic for implementing decode logic 28 will be apparent to those skilled in the art having reference to this specification.

It is contemplated that fusible link circuits according to these embodiments may include more than three fusible links, to encode a digital word with more than two bits. In the general case, a number n of fusible links connected in parallel can encode a digital word of up to m bits, where $m=\log_2(n+1)$. For example, seven fusible links can encode a three-bit digital word. In addition, the number n of the parallel fusible links also defines the number of distinct programming voltages (i.e., n+1 programming voltages, including the 0 volt or low voltage level that blows none of the links), and also the number of comparator levels required of the sense circuit. It is contemplated that those skilled in the art having reference to this specification will be readily able to realize such alternative arrangements, which are contemplated to be within the scope of this invention as claimed below.

These embodiments provide important advantages over conventional fusible link circuits. As mentioned above, the chip area overhead of conventional fuse-based registers and stores is overwhelming, with the peripheral programming and sense circuitry requiring as much as 70× the chip area of the fusible link itself. According to these embodiments, however, approximately the same peripheral chip area supports more than one bit, greatly reducing the effective overhead chip area per bit stored. For example, one implementation of a three-fuse, two-bit arrangement in the manner described above provided at least about 40% reduction in the chip area per bit for its implementation as compared with the conventional approach. Accordingly, the manufacturing cost of the integrated circuit including fuse-programmable registers and memory locations can be greatly reduced; conversely, additional flexibility in the configuration of the integrated circuit, by providing a greater capacity for programmable configuration registers and the like, may be provided without an increase in the overall chip area.

Fuse-programmable registers are often arranged serially, such that data are communicated serially into and serially out from the bank of fusible link circuits constituting the register. This serial data communication of course reduces the number of conductors to be routed to and from the register. Since fuse-programmable configuration or trim registers are less commonly accessed than general purpose registers in the CPU, for example, often the designer will opt for such serial data communication with the fuse-programmable registers. However, as mentioned above in connection with the Background of the Invention, serial communication of the wide data words commonly used in modern integrated circuits can require an inordinate amount of time, resulting in significant latency in some operations of the device. As will now be described in connection with FIG. 6, the multi-bit fusible link circuit of these embodiments can reduce this latency in such serially connected registers and fuse-programmable stores.

Figure 6:
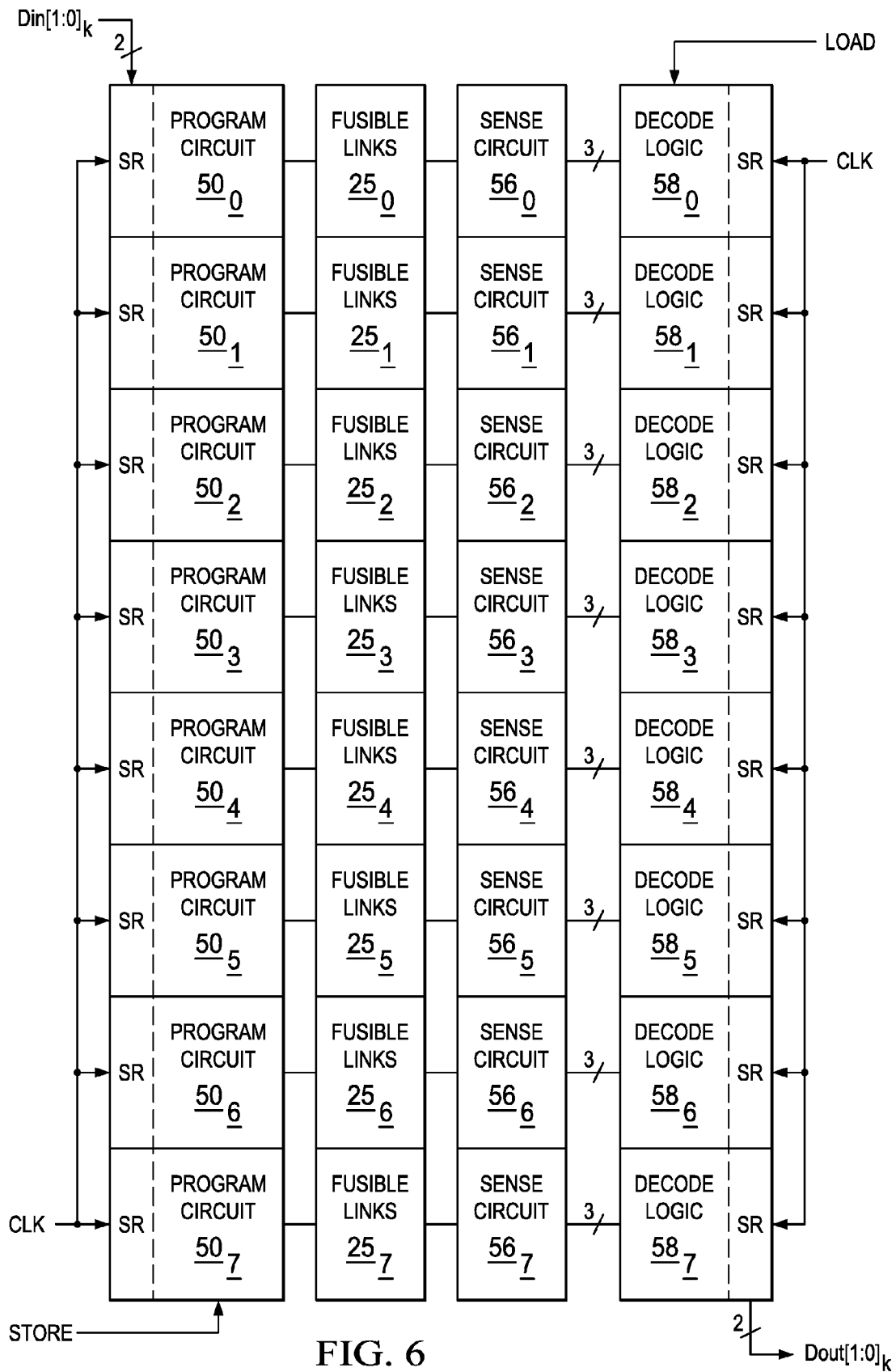
FIG. 6 is an electrical diagram, in block form, of the architecture of a programmable circuit as implemented in the SoC device of FIG. 1 according to an embodiment in which programming data are serially input and the contents are serially output.

In the example of FIG. 6, a register location including eight sets of fusible links $25_0$ through $25_7$ are provided, each associated with a corresponding one of programming circuits $50_0$ through $50_7$, respectively, a corresponding one of sense circuits $56_0$ through $56_7$, respectively, and a corresponding one of decode logic circuits $58_0$ through $58_7$, respectively. As such, each instance of programming circuit $50_k$, fusible links $25_k$, sense circuit $56_k$, and decode logic $58_k$ operates in the manner described above in connection with FIGS. 2 through 5 and its various alternatives. For example, if each instance of fusible links $25_k$ includes three fusible links 25H, 25M, 25L as described above, each of these entries within the register location of FIG. 6 encodes two digital bits, resulting in this register storing the digital equivalent of a sixteen bit digital word.

Programming circuits $50_0$ through $50_7$ in this embodiment differ from programming circuit 20 described above, in that each includes an input shift register stage for storing two bits of digital data. As shown in FIG. 6, these shift register stages in programming circuits $50_0$ through $50_7$ are serially connected with one another in order from programming circuit $50_0$ to programming circuit $50_7$, each receiving a clock signal CLK in response to which the stage loads in the data states (two bits) from the previous stage in the sequence, in conventional shift register fashion. Each of programming circuits $50_0$ through $50_7$ receive a control signal STORE from control logic elsewhere in SoC 400, in response to which the contents of these each shift register stage are applied to its corresponding multiplexer 20 (FIG. 3). Similarly, the instances of decode logic circuits $58_0$ through $58_7$ each include an output shift register stage, with these stages serially connected with one another in order from decode logic circuit $58_0$ to decode logic circuit $50_8$. Each of these shift register stages in decode logic circuits $58_0$ through $58_7$ also receives clock signal CLK, in response to which the stage loads data from the previous stage, in conventional shift register fashion. Each of decode logic circuits $58_0$ through $58_7$ receive a load signal LOAD from control logic elsewhere in SoC 400, in response to which the digital output word $Dout[1:0]_k$ for a given instance of decode logic $58_k$ is loaded into its output shift register stage.

In operation, the register location of FIG. 6 is initially programmed by synchronously applying a sequence of input digital words $Din[1:0]_k$ to the shift register stage of programming circuit $50_0$, and shifting these data along the sequence with cycles of clock signal CLK. On completion of the necessary cycles of clock signal CLK, the data to be programmed into the corresponding instances of fusible links $25_0$ through $25_7$ reside in the input shift register stages of corresponding programming circuits $50_0$ through $50_7$. Issuance of the STORE signal causes these data to be applied to their respective multiplexers 20, and programming of fusible links $25_0$ through $25_7$ is performed. Conversely, the reading of the contents of the register is performed by sense circuits $56_0$ through $56_7$ sensing the programmed states of corresponding sets of fusible links $25_0$ through $25_7$ as described above, and by decode logic circuits $58_0$ through $58_7$ converting those results of the comparisons into two-bit digital output words. Issuance of the LOAD signal causes these data to be loaded into the shift register stages of decode logic circuits $58_0$ through $58_7$, following which a sequence of cycles of clock signal CLK will sequentially read out the digital output words $Din[1:0]_k$.

In this embodiment, the potential latency of a fuse-programmable register location or other store in an integrated circuit can be reduced by 50%, for the case in which each set of fusible links $25_k$ encodes two data bits. This results from each cycle of clock signal CLK clocking out two data bits (or clocking in two data bits for the programming operation). Accordingly, this implementation not only attains the dramatic decrease in chip area required for realization of a fuse-programmable register, but also provides improved performance by reducing the latency of data communication from and to such register locations.

While one or more embodiments have been described in this specification, it is of course contemplated that modifications of, and alternatives to, these embodiments, such modifications and alternatives capable of obtaining one or more the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A programmable fusible link circuit in an integrated circuit, comprising:
   first, second, and third fusible links connected in parallel with one another;
   a programming circuit configured to apply a programming voltage across the parallel connected fusible links, the programming voltage selected, responsive to a digital control word of at least two bits, over a range of voltages including a first programming voltage of the first fusible link, a second programming voltage of the second fusible link, and a third programming voltage of the third fusible link;
   a sense circuit configured to output a digital output word of at least two bits corresponding to a resistance of the parallel connected fusible links, wherein the sense circuit comprises:
      a voltage source configured to apply a read voltage across the across the parallel connected fusible links; and
      current comparator circuitry configured to compare a current conducted by the parallel connected fusible links to each of first, second, and third threshold levels, wherein the current comparator circuitry includes a comparator having a first input that receives the current conducted by the parallel connected fusible links, and having a second input that sequentially receives each of the first, second, and third threshold levels, and wherein the current comparator circuitry is configured to compare the current to each one of the first, second, and third threshold levels such that each comparison of the current to one of the first, second, and third threshold levels is not dependent on a comparison of the current to any other one of the first, second, and third threshold levels; and
   decode logic configured to generate the digital output word responsive to the comparisons by the current comparator circuitry.

2. The circuit of claim 1, wherein the first programming voltage is of a magnitude that opens the first fusible link but not the second and third fusible links;
   wherein the second programming voltage is of a magnitude that opens the first and second fusible links but not the third fusible link;
   and wherein the third programming voltage is of a magnitude that opens the first, second, and third fusible links.

3. The circuit of claim 2, wherein the first, second, and third fusible links are constructed to have different sheet resistances from one another.

4. The circuit of claim 3, wherein each of the first, second, and third fusible links comprises polysilicon.

5. The circuit of claim 4, wherein the first and second fusible links comprise polysilicon of the same dopant concentration;
   wherein the third fusible link comprises polysilicon of a lighter dopant concentration;
   and wherein the first fusible link further comprises a metal silicide.

6. The circuit of claim 1, wherein the current conducted by the parallel connected fusible links is greater than the first threshold level if none of the fusible links is programmed;
   wherein the current conducted by the parallel connected fusible links is greater than the second threshold level and less than the first threshold level if the first fusible link is programmed and the second and third fusible links are not programmed;
   wherein the current conducted by the parallel connected fusible links is greater than the third threshold level and less than the second threshold level if the first and second fusible links are programmed and the third fusible link is not programmed;
   and wherein the current conducted by the parallel connected fusible links is less than the third threshold level if the first, second, and third fusible links are programmed.

7. The circuit of claim 1, wherein the first threshold level is greater than the second threshold level and the second threshold level is greater than the third threshold level, and wherein the current is compared to the first threshold level to produce a first comparison result, compared to the second threshold level to produce a second comparison result, and compared to the third threshold level to produce a third comparison result.

8. The circuit of claim 7, wherein the decode logic includes a multiplexer having a first input that receives an input signal based upon the first and second comparison results and a second input that receives a 0 logic state, wherein the output of the multiplexer is determined by a control signal based upon the second and third comparison results and provides a first bit of the digital output word; and
   an inverter that inverts the second comparison result to provide a second bit of the digital output word.

9. The circuit of claim 8, wherein the decode logic comprises:
   a NAND logic gate that receives the first and second comparison results as inputs and outputs the input signal; and
   an OR gate that receives the second and third comparison results as inputs and outputs the control signal.

10. A method of programming and reading a programmable circuit, comprising the steps of:
    receiving a digital control word of at least two bits;
    applying a programming voltage across first, second, and third fusible links connected in parallel with one another, the programming voltage selected, responsive to the value of the digital control word, from a plurality of voltages comprising a first programming voltage of the first fusible link, a second programming voltage of the second fusible link, and a third programming voltage of the third fusible link;
    then applying a read voltage across the across the parallel connected fusible links;
    during the step of applying the read voltage, comparing a current conducted by the parallel connected fusible links to each of first, second, and third threshold levels using a comparator having a first input that receives the current conducted by the parallel connected fusible links and a second input that sequentially receives each of the first, second, and third threshold levels, wherein comparing the current to each one of the first, second, and third threshold levels is not dependent on a comparison of the current to any other one of the first, second, and third threshold levels; and
    decoding the results of the comparing step to generate a digital output word.

11. The method of claim 10, wherein the first programming voltage is of a magnitude that opens the first fusible link but not the second and third fusible links;

wherein the second programming voltage is of a magnitude that opens the first and second fusible links but not the third fusible link;

and wherein the third programming voltage is of a magnitude that opens the first, second, and third fusible links.

12. The method of claim 11, wherein the step of applying the programming voltage comprises:

receiving the first, second, and third programming voltages at inputs of a multiplexer; and forwarding a selected one of the first, second, and third programming voltages to the parallel connected fusible links responsive to the value of the digital control word.

13. The method of claim 12, wherein the step of applying the programming voltage further comprises:

applying a ground voltage to the parallel connected fusible links responsive to the value of the digital control word indicating that no fusible links are to be programmed.

14. The method of claim 10, wherein the programmable circuit corresponds to one of a plurality of programmable circuits configured as a register;

and further comprising:

serially shifting a sequence of digital control words along the plurality of programmable circuits; and after the shifting step, applying, in parallel, programming voltages to the plurality of programmable circuits responsive to the shifted sequence of digital control words.

15. The method of claim 14, further comprising:

performing the decoding step for each of the plurality of programmable circuits; and then serially shifting the digital output words along the plurality of programmable circuits to an output of the register.

16. The method of claim 10, wherein the programmable circuit corresponds to one of a plurality of programmable circuits configured as a register;

and further comprising:

performing the decoding step for each of the plurality of programmable circuits;

then serially shifting the digital output words along the plurality of programmable circuits to an output of the register.

* * * * *